United States Patent
Kuo et al.

(10) Patent No.: US 11,488,683 B2
(45) Date of Patent: Nov. 1, 2022

(54) DEVICE FOR DETECTING MARGIN OF CIRCUIT OPERATING AT CERTAIN SPEED

(71) Applicant: REALTEK SEMICONDUCTOR CORPORATION, Hsinchu (TW)

(72) Inventors: Chun-Yi Kuo, Hsinchu (TW); Ying-Yen Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/368,436

(22) Filed: Jul. 6, 2021

(65) Prior Publication Data

US 2022/0036962 A1 Feb. 3, 2022

(30) Foreign Application Priority Data

Jul. 28, 2020 (TW) ................................ 109125421

(51) Int. Cl.
*G11C 29/50* (2006.01)
*H03K 5/01* (2006.01)
(Continued)

(52) U.S. Cl.
CPC .. *G11C 29/50012* (2013.01); *G01R 31/31712* (2013.01); *G01R 31/31727* (2013.01);
(Continued)

(58) Field of Classification Search
CPC . G11C 29/50012; G11C 11/418; G11C 7/222; G11C 2207/2254; G11C 29/023; G11C 29/028; G01R 31/31712; G01R 31/31727; G01R 31/3016; H03K 5/01; H03K 5/13; H03K 2005/00019
See application file for complete search history.

(56) References Cited

U.S. PATENT DOCUMENTS 4,233,525 A 11/1980 Takahashi et al.
4,497,056 A * 1/1985 Sugamori .......... G01R 31/3191
714/736

(Continued)

FOREIGN PATENT DOCUMENTS

| CN | 104135256 B | 2/2017 |
|---|---|---|
| TW | 201434050 A | 9/2014 |
| TW | 201710832 A | 3/2017 |

*Primary Examiner* — Ajay Ojha
(74) *Attorney, Agent, or Firm* — WPAT, PC

(57) ABSTRACT

Disclosed is a device for detecting the margin of a circuit operating at an operating speed. The device includes: a signal generating circuit generating an input signal including predetermined data; a first adjustable delay circuit delaying the input signal by a first delay amount and thereby generating a delayed input signal; a circuit under test performing a predetermined operation based on a predetermined operation timing and thereby generating a to-be-tested signal according to the delayed input signal; a second adjustable delay circuit delaying the to-be-tested signal by a second delay amount and thereby generating a delayed to-be-tested signal; a comparison circuit comparing the data included in the delayed to-be-tested signal with the predetermined data based on the predetermined operation timing and thereby generating a comparison result; and a calibration circuit determining whether the circuit under test passes a speed test according to the comparison result.

18 Claims, 6 Drawing Sheets

(51) Int. Cl.
 *G11C 11/418* (2006.01)
 *G01R 31/317* (2006.01)
 *H03K 5/13* (2014.01)
 *H03K 5/00* (2006.01)

(52) U.S. Cl.
 CPC .............. *G11C 11/418* (2013.01); *H03K 5/01* (2013.01); *H03K 5/13* (2013.01); *H03K 2005/00019* (2013.01)

(56) References Cited

U.S. PATENT DOCUMENTS

| | | | |
|---|---|---|---|
| 5,453,954 A * | 9/1995 | Nakamura | ............ G11C 29/50 365/201 |
| 8,248,136 B1 | 8/2012 | Zhang et al. | |
| 9,772,670 B2 | 9/2017 | Yu et al. | |
| 10,686,433 B1 | 6/2020 | Kuo et al. | |
| 10,763,836 B2 | 9/2020 | Kuo et al. | |
| 2004/0257723 A1 | 12/2004 | Naffziger | |
| 2009/0256577 A1* | 10/2009 | Hasumi | ................. H03L 7/087 327/158 |
| 2014/0237302 A1 | 8/2014 | Berry, Jr. et al. | |
| 2014/0244947 A1 | 8/2014 | Song | |
| 2017/0060221 A1 | 3/2017 | Yu et al. | |
| 2017/0301381 A1 | 10/2017 | Seomun et al. | |

* cited by examiner

DEVICE FOR DETECTING MARGIN OF CIRCUIT OPERATING AT CERTAIN SPEED

BACKGROUND OF THE INVENTION

1. Field of the Invention

The present invention relates to a device for speed detection, especially to a device for detecting the margin of a circuit operating at an operating speed.

2. Description of Related Art

The operating speed of an integrated circuit (IC) is subject to its manufacturing process, voltage, temperature, aging status, etc., wherein the manufacturing process is unchangeable once the IC is produced, the voltage is under the influences of the environmental condition (e.g., an unstable external power source) and the usage/condition of the IC (e.g., the IC or a device including the IC being used for executing a specific application program; or the IR drop of the IC), the temperature is under the influences of the environmental condition (e.g., the weather) and the usage/condition of the IC (e.g., the IC or a device including the IC being used for executing a specific application program; or the IC power), and the aging status is dependent upon the remaining life of the IC.

In consideration of the influences of the process, voltage, temperature, and aging status (PVTA) and their interaction, the operating speeds or features of different ICs are usually not the same. A conventional speed binning technique is often used for grouping ICs by their operating speeds and fixing the specification and price of each IC group. In addition, a conventional adaptive voltage scaling (AVS) technique is often used for determining how much voltage should be provided for an IC according to the features of the IC, so as to achieve the purposes of power consumption, service-life extension, and high operating speed. All the above-mentioned techniques need to ascertain the operating speeds or features of ICs. The operating speed of some IC is limited to the operating speed of an embedded macro circuit (e.g., a static random access memory (SRAM) or an analog circuit) of the IC.

Several techniques capable of measuring the operating speed of an IC are listed below:
(1) Ring oscillator. This technique can estimate the operating speed of an IC by monitoring the operating speed of a ring oscillator, but the problems of this technique are slow response and impossible to measure the voltage variation within a short period of time.
(2) Voltage meter/temperature meter. This technique measures the voltage/temperature of the internal part of an IC to estimate the operating speed of the IC, but the problems of this technique are consuming a lot of circuit area, requiring conversion of the measurement result to obtain the operating speed of the IC, and slow response.
(3) Critical path monitoring. This technique measures the signal delay caused by the critical path of an IC to estimate the operating speed of the IC, but the problems of this technique are a complicated design flow because the critical path is usually uncertain till the late stage of the design of the IC, hard to find out the dominant critical path because different critical paths of the IC are dominant in different environmental conditions respectively, and impossible to monitor all of the critical paths.

SUMMARY OF THE INVENTION

An object of the present disclosure is to provide a device for detecting the margin of a circuit operating at an operating speed without the problems of the prior arts.

An embodiment of the device of the present disclosure includes a signal generating circuit, a first adjustable delay circuit, a circuit under test (CUT), a second adjustable delay circuit, a comparison circuit, and a calibration circuit. The signal generating circuit is configured to generate an input signal including predetermined data at a beginning of a detection process. The first adjustable delay circuit is coupled to the signal generating circuit, and configured to delay the input signal by a first delay amount to generate a delayed input signal. The CUT is coupled to the first adjustable delay circuit, and configured to perform a predetermined operation after the beginning of the detection process to generate a to-be-tested signal according to the delayed input signal, wherein the predetermined operation is based on a predetermined operation timing. The second adjustable delay circuit is coupled to the CUT, and configured to delay the to-be-tested signal by a second delay amount in the detection process to generate a delayed to-be-tested signal. The comparison circuit is coupled to the second adjustable delay circuit, and configured to compare the data included in the delayed to-be-tested signal with the predetermined data according to the predetermined operation timing in the detection process and thereby generate a comparison result. The calibration circuit is coupled to the comparison circuit, and configured to determine whether the CUT passes a speed test according to the comparison result in the detection process.

Another embodiment of the device of the present disclosure includes a signal generating circuit, an adjustable delay circuit, a circuit under test (CUT), a comparison circuit, and a calibration circuit. The signal generating circuit is configured to generate an input signal including predetermined data at a beginning of a detection process. The adjustable delay circuit is coupled to the signal generating circuit, and configured to delay the input signal by a certain delay amount to generate a delayed input signal. The circuit under test (CUT) is coupled to the adjustable delay circuit, and configured to perform a predetermined operation after the beginning of the detection process to generate a to-be-tested signal according to the delayed input signal, wherein the predetermined operation is based on a predetermined operation timing. The comparison circuit is coupled to the CUT, and configured to compare the data included in the to-be-tested signal with the predetermined data according to the predetermined operation timing in the detection process and thereby generate a comparison result. The calibration circuit is coupled to the comparison circuit, and configured to determine whether the CUT passes a speed test according to the comparison result in the detection process.

A further embodiment of the device of the present disclosure includes a signal generating circuit, a circuit under test (CUT), an adjustable delay circuit, a comparison circuit, and a calibration circuit. The signal generating circuit is configured to generate an input signal including predetermined data at a beginning of a detection process. The circuit under test (CUT) is coupled to the signal generating circuit, and configured to perform a predetermined operation after the beginning of the detection process to generate a to-be-tested signal according to the input signal, wherein the predetermined operation is based on a predetermined operation timing. The adjustable delay circuit is coupled to the CUT, and configured to delay the to-be-tested signal by a certain delay amount to generate a delayed to-be-tested signal. The comparison circuit is coupled to the adjustable delay circuit, and configured to compare the data included in the delayed to-be-tested signal with the predetermined data according to the predetermined operation timing in the detection process and thereby generate a comparison result. The calibration circuit is coupled to the comparison circuit, and configured to determine whether the CUT passes a speed test according to the comparison result in the detection process.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present disclosure includes a device for detecting the margin of a circuit under test (CUT) operating at an operating speed. This device can efficiently detect the above-mentioned margin in a calibration process, and can monitor whether the CUT passes a speed test in a monitoring process.

Figure 1:
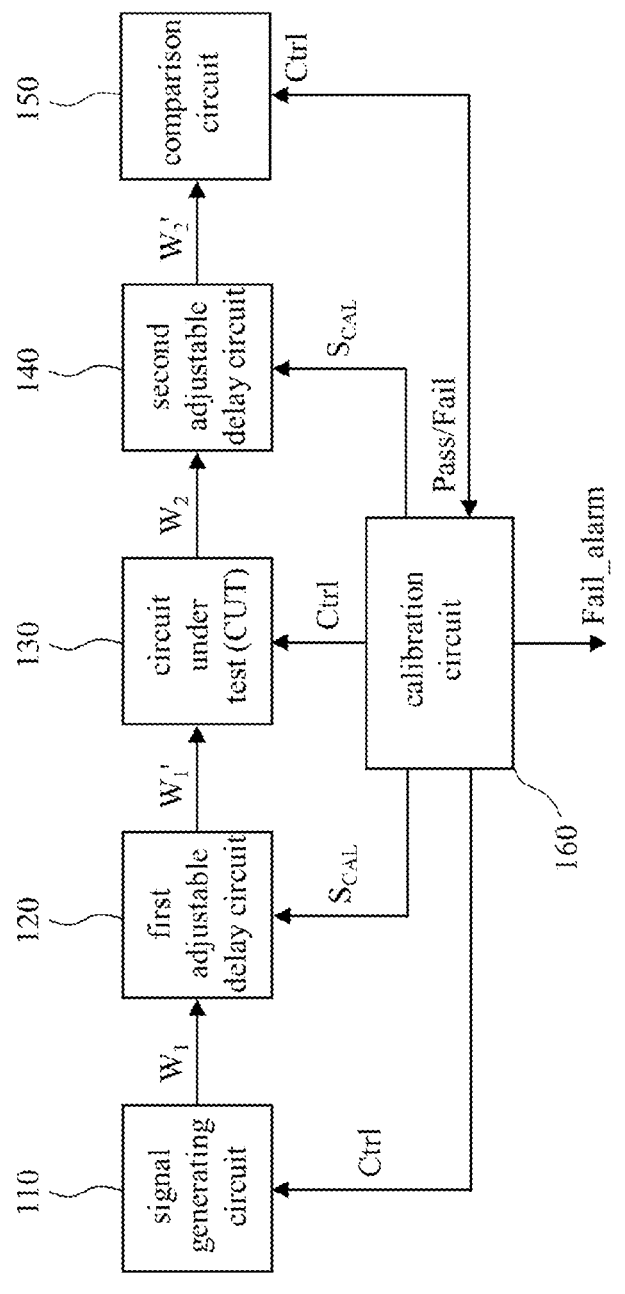
FIG. 1 shows an embodiment of the device of the present disclosure for detecting the margin of a circuit under test (CUT) operating at an operating speed.

FIG. 1 shows an embodiment of the device of the present disclosure for detecting the margin of a CUT operating at an operating speed. The device 100 of FIG. 1 includes a signal generating circuit 110, a first adjustable delay circuit 120, a circuit under test (CUT) 130, a second adjustable delay circuit 140, a comparison circuit 150, and a calibration circuit 160. According to the demand for implementation, one of the second adjustable delay circuit 140 and the first adjustable delay circuit 120 can be omitted/disabled (e.g., none of the delay components in the disabled delay circuit 140/120 having influence). When the second adjustable delay circuit 140 is omitted/disabled, the device 100 uses the first adjustable delay circuit 120 to detect the margin of the CUT 130 receiving a signal at an input speed, which can be understood as the detection of the tolerant time limit for signal reception of the CUT 130. When the first adjustable delay circuit 120 is omitted/disabled, the device 100 uses the second adjustable delay circuit 140 to detect the margin of the CUT 130 transmitting a signal at an output speed, which can be understood as the detection of the tolerant time limit for signal transmission of the CUT 130. Since people having ordinary skill in the art can refer to the present specification and figures to appreciate the modifications to the circuit connection and signal relation of the device 100 as a result of the second/first adjustable delay circuit 140/120 being omitted/disabled, repeated and redundant description is omitted here.

Please refer to FIG. 1. The signal generating circuit 110 is configured to generate an input signal ($W_1$) including pre-determined data at the beginning of a detection process. For instance, in a circumstance that the CUT 130 includes a storage circuit (e.g., a static random access memory (SRAM); a content addressable memory (CAM) such as a binary CAM (BCAM) or a ternary CAM (TCAM); or an embedded dynamic random access memory (eDRAM)), the input signal includes a write signal including the predetermined data and a write address corresponding to an address of the storage circuit. In a circumstance that the CUT 130 includes a transmission interface, the input signal includes a transmission signal including the predetermined data. In a circumstance that the CUT 130 includes a converter including an analog-to-digital converter (ADC) and a digital-to-analog converter (DAC), the input signal includes an analog signal including the predetermined data. The predetermined data could be a signal indicative of a predetermined number, a signal having a predetermined pattern, or a signal suitable for comparison.

Figure 2:
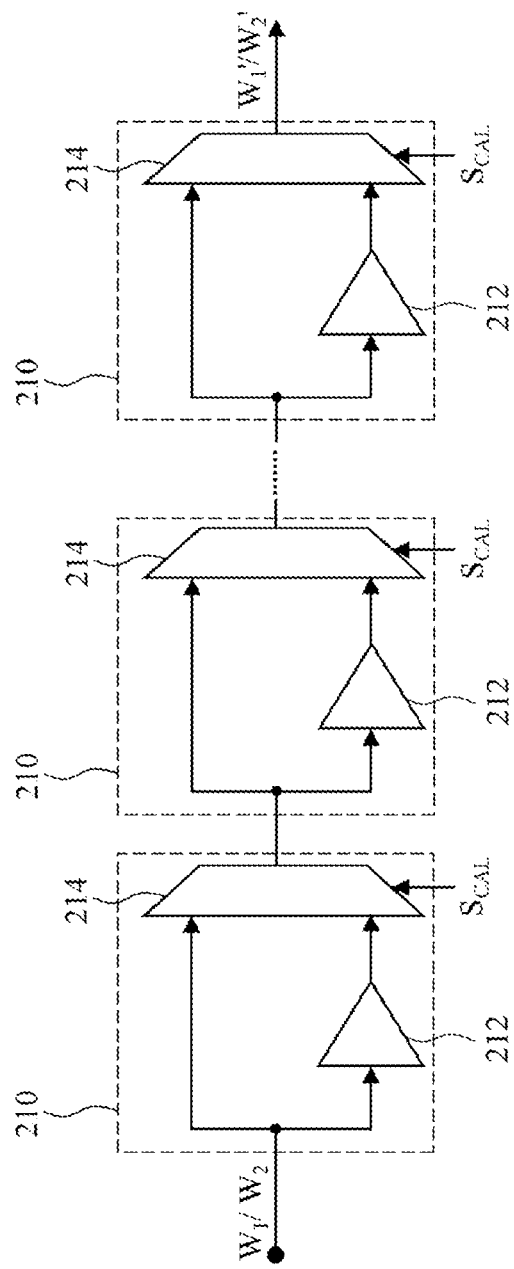
FIG. 2 shows an embodiment of the first/second adjustable delay circuit of FIG. 1.
Figure 3:
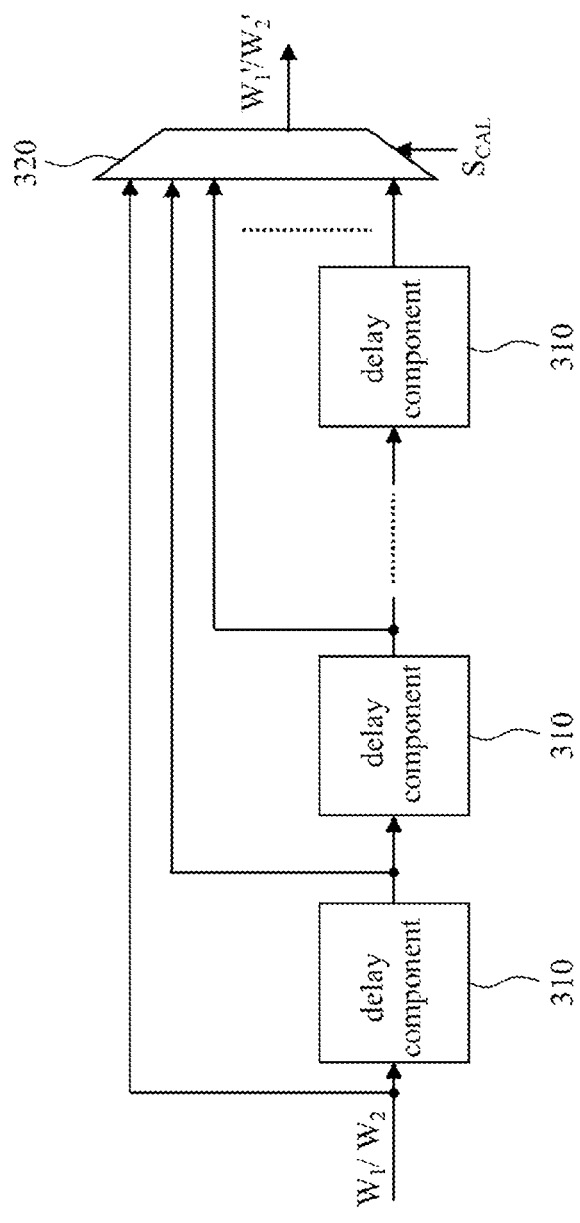
FIG. 3 shows another embodiment of the first/second adjustable delay circuit of FIG. 1.

Please refer to FIG. 1. The first adjustable delay circuit 120 is coupled to the signal generating circuit 110, and configured to delay the input signal ($W_1$) by a first delay amount to generate a delayed input signal ($W_1'$). An embodiment of the first adjustable delay circuit 120 is shown in FIG. 2, and includes a plurality of delay units 210 that are connected in series. Each delay unit 210 includes a delay component 212 and a multiplexer 214. The multiplexer 214 is controlled by the calibration circuit 160 to output a signal from the delay component 212 or to output a signal bypassing the delay component 212; accordingly, the plurality of delay units 210 jointly contribute an adjustable delay amount according to the control (i.e., $S_{CAL}$) from the calibration circuit 160. Another embodiment of the first adjustable delay circuit 120 is shown in FIG. 3, and includes a plurality of delay components 310 and a multiplexer 320. The plurality of delay components 310 are connected in series; the input terminal of the first delay component 310 and the output terminals of all the delay components 310 are coupled to the multiplexer 320, and the multiplexer 320 is controlled by the calibration circuit 160 to output the signal from one of these terminals; accordingly, the plurality of delay components 310 and the multiplexer 320 jointly contribute an adjustable delay amount according to the control (i.e., $S_{CAL}$) from the calibration circuit 160. Other embodiments of adjustable delay circuits can be derived from the embodiments of FIGS. 2-3 and/or known/self-developed delay circuits.

Figure 4:
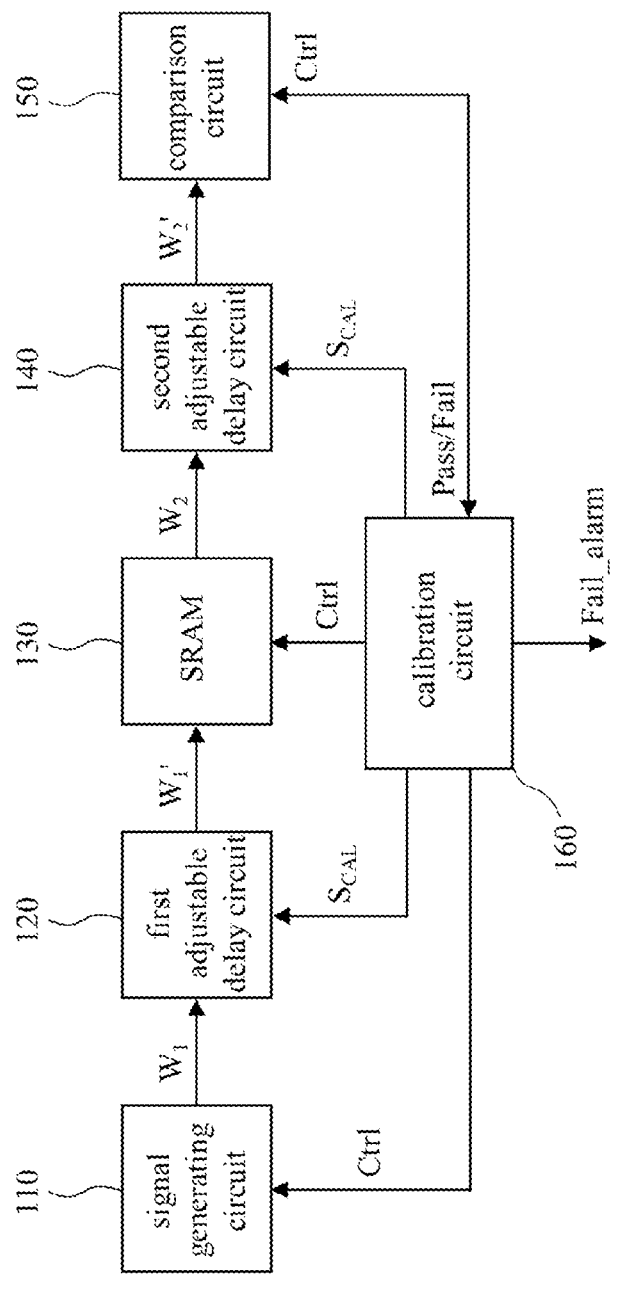
FIG. 4 shows an embodiment of the CUT of FIG. 1.
Figure 5:
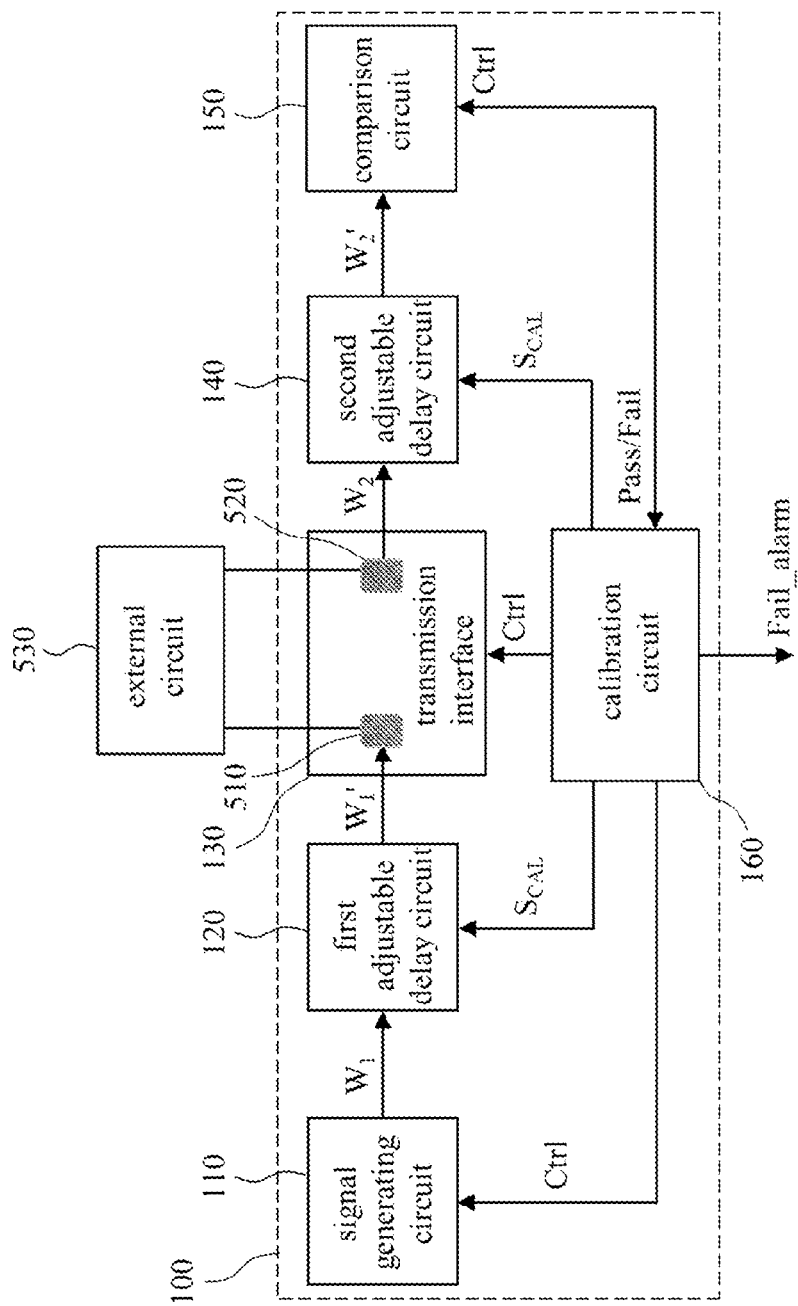
FIG. 5 shows another embodiment of the CUT of FIG. 1.
Figure 6:
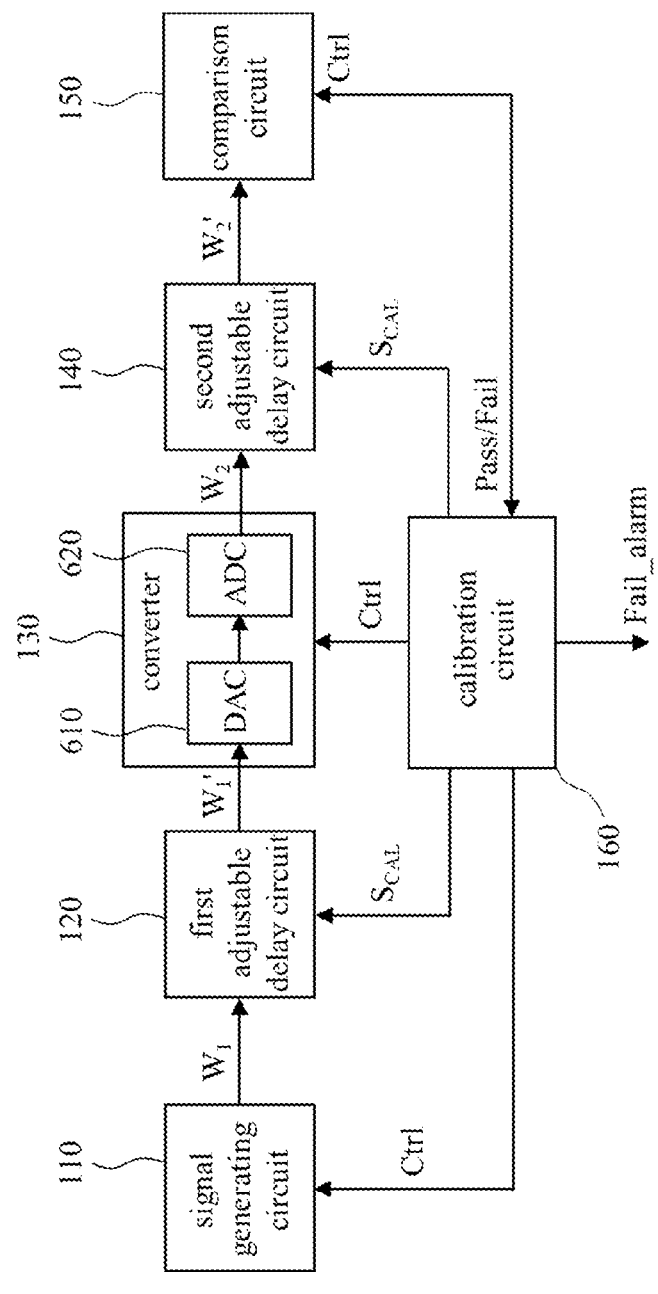
FIG. 6 shows a further embodiment of the CUT of FIG. 1.

Please refer to FIG. 1. The CUT 130 is coupled to the first adjustable delay circuit 120, and configured to perform a predetermined operation after the beginning of the detection process to generate a to-be-tested signal ($W_2$) according to the delayed input signal ($W_1'$), wherein the predetermined operation is based on a predetermined operation timing. The CUT 130 is an embedded circuit or another kind of circuits according to the demand for implementation. FIG. 4 shows an embodiment of the CUT 130; in this embodiment, the CUT 130 is an SRAM, the input signal includes a write address corresponding to a certain address of the SRAM, the predetermined operation is a known/self-developed data access operation, and the predetermined operation timing is a known/self-developed SRAM data access operation timing. FIG. 5 shows another embodiment of the CUT 130; in this embodiment, the CUT 130 is a transmission interface including an input pad 510 and an output pad 520, the input pad 510 and the output pad 520 are coupled through an external circuit 530 that is outside the device 100, the input pad 510 receives the delayed input signal in the detection process and outputs the delayed input signal to the external circuit 530, the external circuit 530 transmits the delayed input signal to provide an output, the output pad 520 outputs the to-be-tested signal according to the output of the external circuit 530, and the predetermined operation is a signal transmission operation. FIG. 6 shows a further embodiment of the CUT 130; in this embodiment, the CUT 130 is a converter including a DAC 610 and an ADC 620, the DAC 610 converts the delayed input signal into an analog signal, the ADC 620 converts the analog signal into the to-be-tested signal, and the predetermined operation is a signal conversion operation.

Please refer to FIG. 1. The second adjustable delay circuit 140 is coupled to the CUT 130, and configured to delay the to-be-tested signal ($W_2$) by a second delay amount in the detection process to generate a delayed to-be-tested signal ($W_2$'). An embodiment of the second adjustable delay circuit 140 is the same as the aforementioned embodiment of the first adjustable delay circuit 120. It should be noted that the influence(s) of the delay circuit 120 and/or the delay circuit 140 on the signal ($W_2$') received by the comparison circuit 150 could be tolerable or intolerable, and this depends on the margin of the CUT 130 operating at the operating speed; in other words, the additional delay correlates with the margin of the CUT 130 operating at the operating speed.

Please refer to FIG. 1. The comparison circuit 150 is coupled to the second adjustable delay circuit 140, and configured to compare data included in the delayed to-be-tested signal ($W_2$') with the predetermined data according to the predetermined operation timing in the detection process and thereby generate a comparison result (Pass/Fail), wherein the predetermined data can be stored in the comparison circuit 150 in advance or be inputted to the comparison circuit 150 when needed. If the data included in the delayed to-be-tested signal is the same as the predetermined data, the comparison result is a first comparison result indicating that the operation condition of the CUT 130 for the moment doesn't have a substantial influence on the present additional delay; and if the data included in the delayed to-be-tested signal are different from the predetermined data, the comparison result is a second comparison result indicating that the operation of the CUT 130 for the moment has a substantial influence on present additional delay. The comparison circuit 150 is a known/self-developed comparator.

Please refer to FIG. 1. The calibration circuit 160 is coupled to the comparison circuit 150, and configured to determine whether the CUT 130 passes a speed test according to the comparison result in the detection process. In an exemplary implementation, the detection process is an input-speed/output-speed calibration process. The main steps of the calibration process and the main circuit action in regard to each step are illustrated with Table 1/2 below, but the present invention is not limited thereto. Please refer to Table 1/2. The second/first delay amount is a predetermined delay amount (e.g., a value representing a certain number of delay components, wherein when the value is equal to zero, the second/first adjustable delay circuit 140/120 functions as a disabled delay circuit). If the calibration circuit 160 determines that the data included in the delayed to-be-tested signal is the same as the predetermined data according to the comparison result, the calibration circuit 160 determines that the CUT 130 passes the speed test and then transmits a calibration signal ($S_{CAL}$) to increase the first/second delay amount by a predetermined increment (i.e., increasing the number of enabled delay components 212/310 in FIG. 2/3) and to request the device 100 to perform the calibration process again, wherein the initial setting of the first/second delay amount is zero or some predetermined delay amount. If the calibration circuit 160 determines that the data included in the delayed to-be-tested signal is different from the predetermined data according to the comparison result, the calibration circuit 160 determines that the CUT 130 fails the speed test and then determines that the first/second delay amount is equivalent to the margin of the CUT 130 operating at a first/second operating speed; more specifically, the first/second delay amount is indicative of the worst case the CUT 130 can withstand. In an exemplary implementation, the margin of the CUT 130 operating at the first/second operating speed is proportional to the margin of a target circuit (not shown) operating at the first/second operating speed, wherein the CUT 130 and the target circuit are manufactured with the same process and thus the relation between the operating speeds of the two circuits is predetermined or ascertainable. Accordingly, the margin of the CUT 130 operating at an operating speed is proportional to the margin of the target circuit operating at the same operating speed. In another exemplary implementation, the CUT 130 itself is the target circuit.

TABLE 1

(input-speed calibration process)

| step | Circuit | Action |
|---|---|---|
| 1 | calibration circuit | set the first delay amount for the initial setting (e.g., 0) set the second delay amount for the predetermined delay amount (e.g., 0) |
| 2 | signal generating circuit | reset the CUT according to the calibration circuit's control generate the input signal including the predetermined data |
| 3 | comparison circuit | perform a comparison operation according to the calibration circuit's control based on the predetermined operation timing if the aforementioned first comparison result is obtained, go to step 4; if not, go to step 5 |
| 4 | calibration circuit | adjust the first delay amount to make it be the initial setting plus the number of times the CUT passes the speed test multiplied by the predetermined increment, and then go to step 2 |
| 5 | calibration circuit | treat the first delay amount as the margin of the CUT operating at the first operating speed |

TABLE 2

(output-speed calibration process)

| step | circuit | action |
|---|---|---|
| 1 | calibration circuit | set the first delay amount for the predetermined delay amount (e.g, 0) set the second delay amount for the initial setting (e.g., 0) |
| 2 | signal generating circuit | reset the CUT according to the calibration circuit's control generate the input signal including the predetermined data |
| 3 | comparison circuit | perform a comparison operation according to the calibration circuit's control based on the predetermined operation timing if the aforementioned first comparison result is obtained, go to step 4; if not, go to step 5 |
| 4 | calibration circuit | adjust the second delay amount to make it be the initial setting plus the number of times the CUT passes the speed test multiplied by the predetermined increment, and then go to step 2 |
| 5 | calibration circuit | treat the second delay amount as the margin of the CUT operating at the second operating speed |

Please refer to FIG. 1. In an exemplary implementation, the detection process is a monitoring process. The main steps of the monitoring process and the main circuit action in regard to each step are illustrated with Table 3 below, but the present invention is not limited thereto. Please refer to Table 3. If the calibration circuit 160 determines that the data included in the delayed to-be-tested signal is the same as the predetermined data according to the comparison result, the calibration circuit 160 determines that the CUT 130 passes the speed test and then request the device 100 to perform the monitoring process again. If the calibration circuit 160 determines that the data included in the delayed to-be-tested signal is different from the predetermined data according to the comparison result, the calibration circuit 160 determines that the CUT 130 fails the speed test and then transmits an alert (Fail_alarm) to a user interface (not shown) or an abnormity recordation device (not shown).

TABLE 3

(monitoring process)

| step | circuit | action |
| --- | --- | --- |
| 1 | calibration circuit | set the first delay amount for the first delay amount of step 5 in Table 1 minus a user-defined/predetermined first tolerance amount (e.g., set the first delay amount for an amount between a quarter and three quarters of the first delay amount of step 5 in Table 1) set the second delay amount for the second delay amount of step 5 in Table 2 minus a user-defined/predetermined second tolerance amount (e.g., set the second delay amount for an amount between a quarter and three quarters of the second delay amount of step 5 in Table 2) |
| 2 | signal generating circuit | reset the CUT according to the calibration circuit's control generate the input signal including the predetermined data |
| 3 | comparison circuit | perform a comparison operation according to the calibration circuit's control based on the predetermined operation timing if the aforementioned first comparison result is obtained, go to step 4; if not, go to step 5 |
| 4 | calibration circuit | go to step 1 |
| 5 | calibration circuit | transmit an alert to a user interface or an abnormity recordation device |

Please refer to FIG. 1 and FIG. 4. In an exemplary implementation, the CUT 130 includes an SRAM, the input signal includes a write address corresponding to a certain address of the SRAM, and the predetermined operation is a data access operation; through the control of a plurality of operations, the calibration circuit 160 requests the device 100 to perform the calibration process again. The plurality of operations include:

(1) requesting the signal generating circuit 110 to generate the input signal;
(2) requesting the CUT 130 to be reset, wherein the signal generating circuit 110 can reset the CUT 130 according to the control from the calibration circuit 160, or the calibration circuit 160 itself can reset the CUT 130;
(3) requesting the comparison circuit 150 to perform a comparison operation according to the predetermined operation timing.

It should be noted that the generation of the input signal, the execution of the predetermined operation, and the execution of the comparison operation are based on the same predetermined operation timing, and therefore the delay caused by the first/second delay circuit 120/140 has an influence on the comparison result. Accordingly, the calibration circuit 160 can issue a control signal (Ctrl) to allow the plurality of operations to be executed synchronously so that all the operations are based on the predetermined operation timing. It should also be noted that the plurality of operations may be executed asynchronously, if practicable.

It should be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the device of the present disclosure can efficiently detect the margin of a CUT operating at an operating speed in a calibration process, and can monitor whether a CUT passes a speed test in a monitoring process.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A device for detecting a margin of a circuit operating at a circuit operating speed, the device comprising:
    a signal generating circuit configured to generate an input signal including predetermined data at a beginning of a detection process;
    a first adjustable delay circuit coupled to the signal generating circuit, and configured to delay the input signal by a first delay amount to generate a delayed input signal;
    a circuit under test (CUT) coupled to the first adjustable delay circuit, and configured to perform a predetermined operation after the beginning of the detection process to generate a to-be-tested signal according to the delayed input signal, wherein the predetermined operation is based on a predetermined operation timing;
    a second adjustable delay circuit coupled to the CUT, and configured to delay the to-be-tested signal by a second delay amount in the detection process to generate a delayed to-be-tested signal;
    a comparison circuit coupled to the second adjustable delay circuit, and configured to compare data included in the delayed to-be-tested signal with the predetermined data according to the predetermined operation timing in the detection process and thereby generate a comparison result; and
    a calibration circuit coupled to the comparison circuit, and configured to determine whether the CUT passes a speed test according to the comparison result in the detection process,
    wherein when the detection process is used as a calibration process: one of the second delay amount and the first delay amount is a predetermined delay amount, and the other one of the second delay amount and the first delay amount is an adjustable delay amount; if the calibration circuit determines that the data included in the delayed to-be-tested signal is the same as the predetermined data according to the comparison result, the calibration circuit determines that the CUT passes the speed test, and thereby increases the adjustable delay amount and requests the device to perform the calibration process again; and if the calibration circuit determines that the data included in the delayed to-be-tested signal is different from the predetermined data according to the comparison result, the calibration circuit determines that the CUT fails the speed test, and thereby determines that the adjustable delay amount is a margin of the CUT operating at an operating speed.

2. The device of claim 1, wherein the second delay amount is the predetermined delay amount, the first delay amount is the adjustable delay amount, and the operating speed is a first operating speed.

3. The device of claim 2, wherein the margin of the CUT operating at the first operating speed is proportional to a margin of a target circuit operating at the first operating speed, the CUT is manufactured with a first process, the target circuit is manufactured with a second process, and the first process is equivalent to the second process.

4. The device of claim 2, wherein the CUT includes a static random access memory (SRAM), the input signal includes a write address corresponding to an address of the SRAM, the predetermined operation is a data access operation, the calibration circuit requests the device to perform the calibration process again through a plurality of operations, and the plurality of operations include: requesting the signal generating circuit to generate the input signal; requesting the CUT to be reset; and requesting the comparison circuit to do comparison according to the predetermined operation timing.

5. The device of claim 4, wherein the calibration circuit has the plurality of operations be performed simultaneously.

6. The device of claim 1, wherein the first delay amount is the predetermined delay amount, the second delay amount is the adjustable delay amount, and the operating speed is a second operating speed.

7. The device of claim 6, wherein the margin of the CUT operating at the second operating speed is proportional to a margin of a target circuit operating at the second operating speed, the CUT is manufactured with a first process, the target circuit is manufactured with a second process, and the first process is equivalent to the second process.

8. The device of claim 6, wherein the CUT includes a static random access memory (SRAM), the input signal includes a write address corresponding to an address of the SRAM, the predetermined operation is a data access operation, the calibration circuit requests the device to perform the calibration process again through a plurality of operations, and the plurality of operations include: requesting the signal generating circuit to generate the input signal; requesting the CUT to be reset; and requesting the comparison circuit to do comparison according to the predetermined operation timing.

9. The device of claim 8, wherein the calibration circuit has the plurality of operations be performed simultaneously.

10. The device of claim 1, wherein the CUT includes an input pad and an output pad; the input pad and the output pad are coupled through an external circuit; the input pad receives the delayed input signal in the detection process and outputs the delayed input signal to the external circuit; the external circuit transmits the delayed input signal to provide an output; the output pad outputs the to-be-tested signal according to the output of the external circuit; and the predetermined operation is a signal transmission operation.

11. The device of claim 1, wherein the CUT includes a digital-to-analog converter (DAC) and an analog-to-digital converter (ADC); the DAC converts the delayed input signal into an analog signal; the ADC converts the analog signal into the to-be-tested signal; and the predetermined operation is a signal conversion operation.

12. The device of claim 1, wherein when the detection process is used as a monitoring process; if the calibration circuit determines that data included in the delayed to-be-tested signal is the same as the predetermined data, the calibration circuit determines that the CUT passes the speed test and requests the device to perform the monitoring process again; and if the calibration circuit determines that the data included in the delayed to-be-tested signal is different from the predetermined data according to the comparison result, the calibration circuit determines that the CUT fails the speed test and the calibration circuit issues an alert.

13. A device for detecting a margin of a circuit operating at a circuit operating speed, the device comprising:
a signal generating circuit configured to generate an input signal including predetermined data at a beginning of a detection process;
an adjustable delay circuit coupled to the signal generating circuit, and configured to delay the input signal by a first delay amount to generate a delayed input signal;
a circuit under test (CUT) coupled to the adjustable delay circuit, and configured to perform a predetermined operation after the beginning of the detection process to generate a to-be-tested signal according to the delayed input signal, wherein the predetermined operation is based on a predetermined operation timing;
a comparison circuit coupled to the CUT, and configured to compare data included in the to-be-tested signal with the predetermined data according to the predetermined operation timing in the detection process and thereby generate a comparison result; and
a calibration circuit coupled to the comparison circuit, and configured to determine whether the CUT passes a speed test according to the comparison result in the detection process,
wherein the CUT includes one of the following:
a static random access memory (SRAM), wherein the input signal includes a write address corresponding to an address of the SRAM, and the predetermined operation is a data access operation;
a transmission interface including an input pad and an output pad, wherein the input pad and the output pad are coupled through an external circuit, the input pad receives the delayed input signal in the detection process and outputs the delayed input signal to the external circuit so that the output pad outputs the to-be-tested signal according to an output of the external circuit, and the predetermined operation is a signal transmission operation; and
a converter including a digital-to-analog converter (DAC) and an analog-to-digital converter (ADC), wherein the DAC converts the delayed input signal into an analog signal, the ADC converts the analog signal into the to-be-tested signal, and the predetermined operation is a signal conversion operation.

14. The device of claim 13, wherein the detection process is a calibration process; if the calibration circuit determines that the data included in the to-be-tested signal is the same as the predetermined data according to the comparison result, the calibration circuit determines that the CUT passes the speed test, and thereby increases the first delay amount and requests the device to perform the calibration process again; and if the calibration circuit determines that the data included in the to-be-tested signal is different from the predetermined data according to the comparison result, the calibration circuit determines that the CUT fails the speed test, and thereby determines that the first delay amount is a margin of the CUT operating at an operating speed.

15. The device of claim 13, wherein the detection process is a monitoring process; if the calibration circuit determines that data included in the to-be-tested signal is the same as the predetermined data, the calibration circuit determines that the CUT passes the speed test and requests the device to perform the monitoring process again; and if the calibration circuit determines that the data included in the to-be-tested signal is different from the predetermined data according to the comparison result, the calibration circuit determines that the CUT fails the speed test and the calibration circuit issues an alert.

16. A device for detecting a margin of a circuit operating at a circuit operating speed, the device comprising:
   a signal generating circuit configured to generate an input signal including predetermined data at a beginning of a detection process;
   a circuit under test (CUT) coupled to the signal generating circuit, and configured to perform a predetermined operation after the beginning of the detection process to generate a to-be-tested signal according to the input signal, wherein the predetermined operation is based on a predetermined operation timing;
   an adjustable delay circuit coupled to the CUT, and configured to delay the to-be-tested signal by a second delay amount to generate a delayed to-be-tested signal;
   a comparison circuit coupled to the adjustable delay circuit, and configured to compare data included in the delayed to-be-tested signal with the predetermined data according to the predetermined operation timing in the detection process and thereby generate a comparison result; and
   a calibration circuit coupled to the comparison circuit, and configured to determine whether the CUT passes a speed test according to the comparison result in the detection process,
   wherein the CUT includes one of the following:
      a static random access memory (SRAM), wherein the input signal includes a write address corresponding to an address of the SRAM, and the predetermined operation is a data access operation;
      a transmission interface including an input pad and an output pad, wherein the input pad and the output pad are coupled through an external circuit, the input pad receives the input signal in the detection process and outputs the input signal to the external circuit so that the output pad outputs the to-be-tested signal according to an output of the external circuit, and the predetermined operation is a signal transmission operation; and
      a converter including a digital-to-analog converter (DAC) and an analog-to-digital converter (ADC), wherein the DAC converts the input signal into an analog signal, the ADC converts the analog signal into the to-be-tested signal, and the predetermined operation is a signal conversion operation.

17. The device of claim 16, wherein the detection process is a calibration process; if the calibration circuit determines that the data included in the delayed to-be-tested signal is the same as the predetermined data according to the comparison result, the calibration circuit determines that the CUT passes the speed test, and thereby increases the second delay amount and requests the device to perform the calibration process again; and if the calibration circuit determines that the data included in the delayed to-be-tested signal is different from the predetermined data according to the comparison result, the calibration circuit determines that the CUT fails the speed test, and thereby determines that the second delay amount is a margin of the CUT operating at an operating speed.

18. The device of claim 16, wherein the detection process is a monitoring process; if the calibration circuit determines that data included in the delayed to-be-tested signal is the same as the predetermined data, the calibration circuit determines that the CUT passes the speed test and requests the device to perform the monitoring process again; and if the calibration circuit determines that the data included in the delayed to-be-tested signal is different from the predetermined data according to the comparison result, the calibration circuit determines that the CUT fails the speed test and the calibration circuit issues an alert.

\* \* \* \* \*